(12) United States Patent
Lee et al.

(10) Patent No.: US 9,076,693 B2
(45) Date of Patent: Jul. 7, 2015

(54) DISPLAY SIGNAL LINES AND METHODS OF FABRICATING THE SAME

(75) Inventors: Yul Kyu Lee, Yongin (KR); Sun Park, Yongin (KR); Jong-Hyun Park, Yongin (KR); Jun Hoo Choi, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 173 days.

(21) Appl. No.: 13/460,404

(22) Filed: Apr. 30, 2012

(65) Prior Publication Data

US 2013/0113000 A1      May 9, 2013

(30) Foreign Application Priority Data

Nov. 3, 2011   (KR) .................. 10-2011-0114102

(51) Int. Cl.
*H01L 27/12* (2006.01)
*H01L 27/32* (2006.01)

(52) U.S. Cl.
CPC ......... *H01L 27/1244* (2013.01); *H01L 27/3276* (2013.01)

(58) Field of Classification Search
CPC ............ H01L 27/1244; H01L 27/3276; H01L 2251/568; G02F 1/136259; G02F 2201/508
USPC ............... 257/88, E27.121; 349/54, 139, 143
See application file for complete search history.

(56) References Cited

U.S. PATENT DOCUMENTS

| 5,303,074 A | * | 4/1994 | Salisbury | ........................ 349/55 |
| 2001/0035920 A1 | * | 11/2001 | Choi | ............................... 349/54 |
| 2012/0092308 A1 | * | 4/2012 | Chiang et al. | ................. 345/204 |

FOREIGN PATENT DOCUMENTS

| KR | 10-0299378 B1 | 6/2001 |
| KR | 10-2008-0010763 A | 1/2008 |
| KR | 10-2011-0052986 A | 5/2011 |

\* cited by examiner

*Primary Examiner* — Tucker Wright
(74) *Attorney, Agent, or Firm* — Knobbe Martens Olson & Bear LLP

(57) ABSTRACT

Display substrates are disclosed. In one aspect, display substrates include a first signal line, a second signal line, a first detour signal line and a second detour signal line. The first signal line includes a first region and a pair of second regions disposed on opposite sides of the first region. The pair of second regions are spaced apart from the first region. The second signal line crosses the first signal line. The second signal line includes a third region and a pair of fourth regions disposed on opposite sides of the third region. The pair of fourth regions are spaced apart from the third region. The first detour signal line electrically connects the pair of second regions to each other. The second detour signal line electrically connects the pair of fourth regions to each other. Related methods are also disclosed.

7 Claims, 19 Drawing Sheets

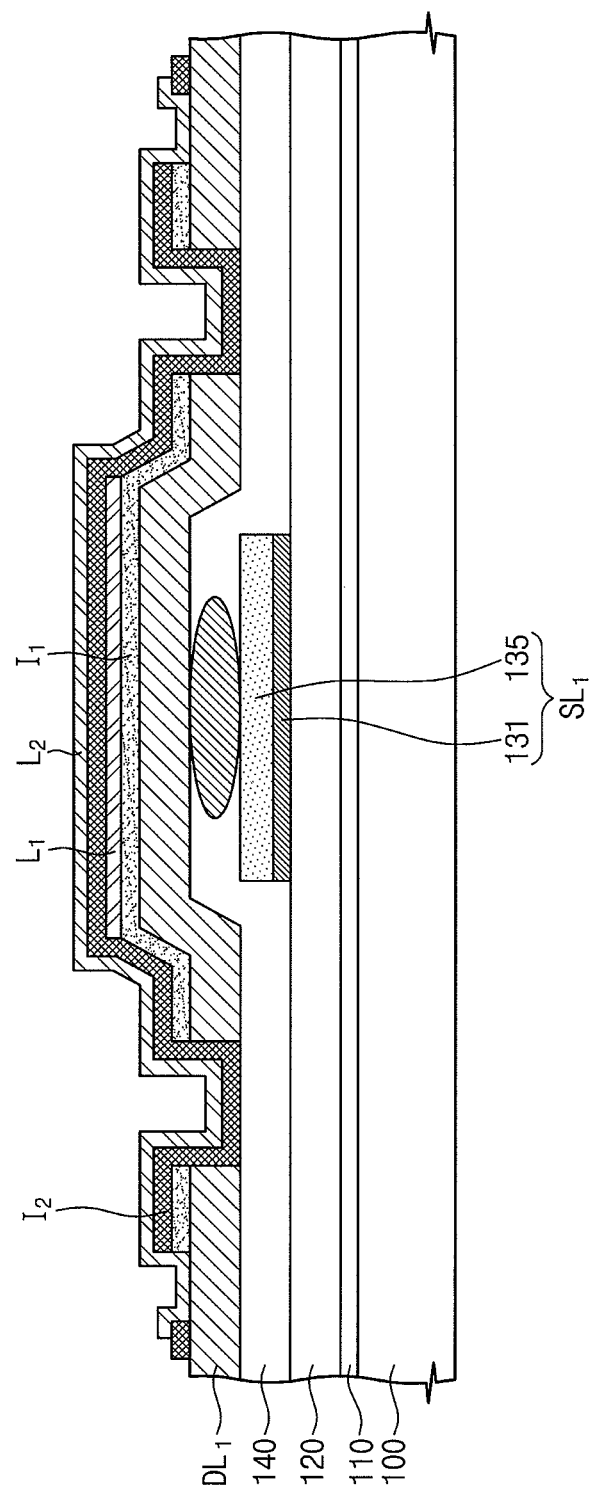

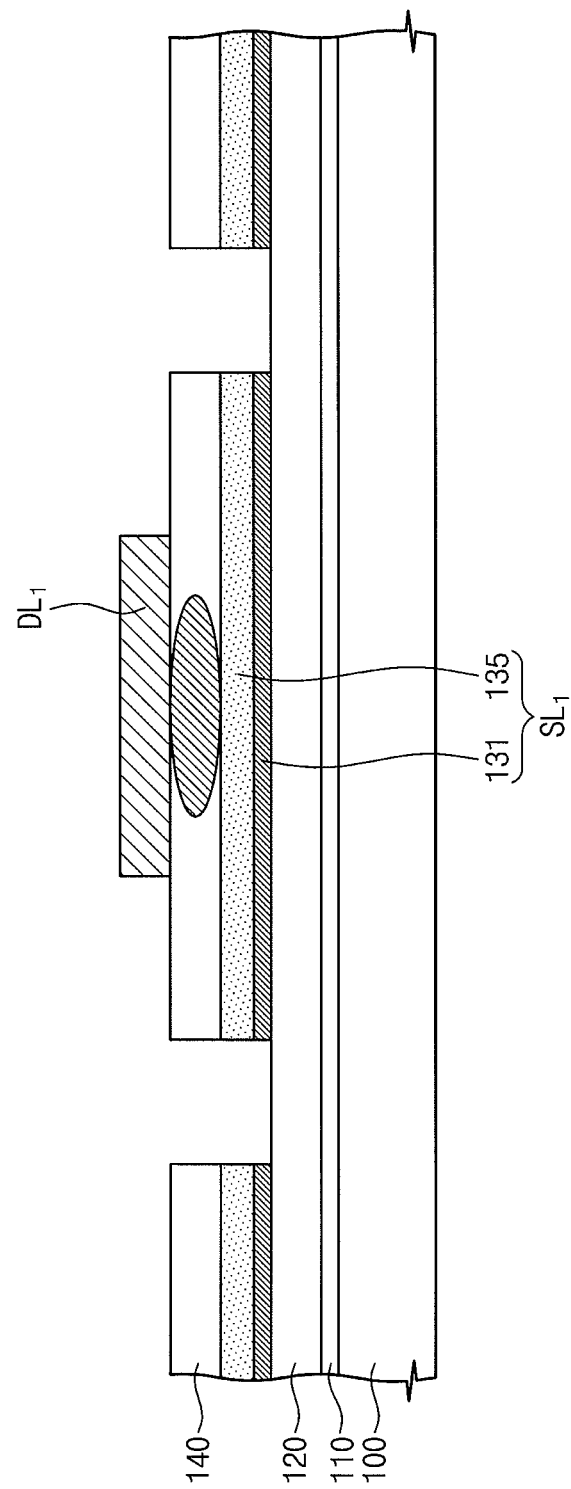

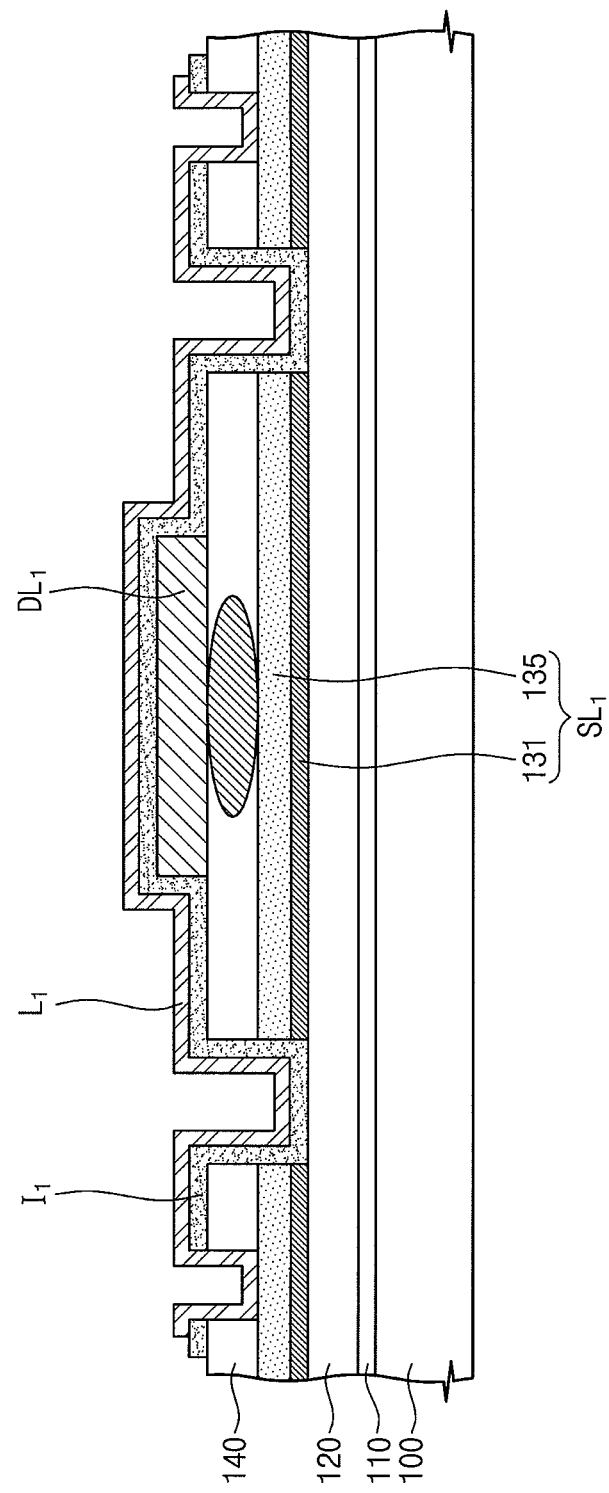

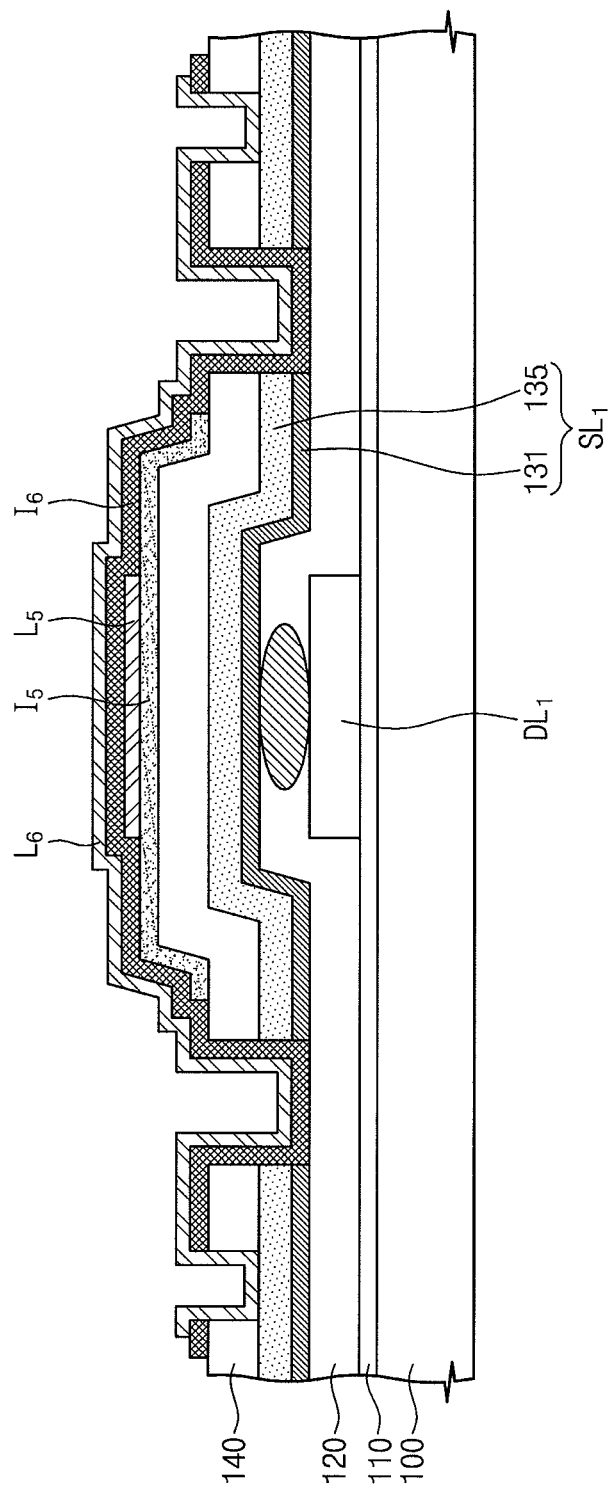

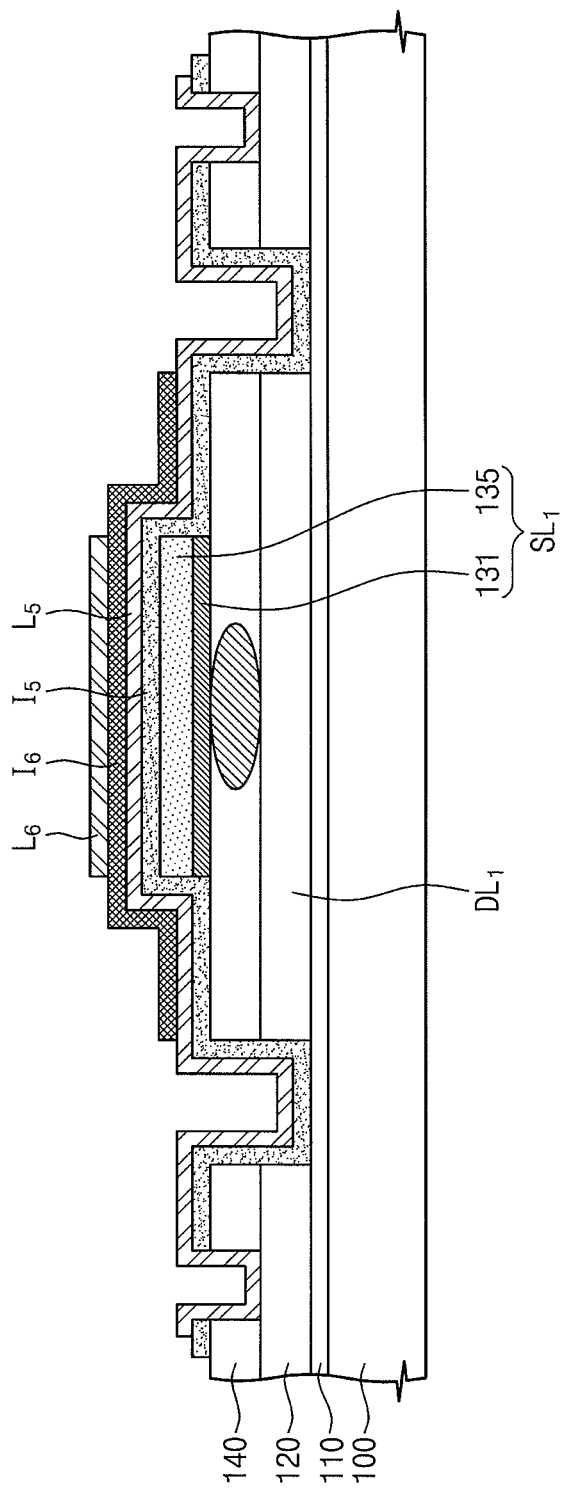

DISPLAY SIGNAL LINES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2011-0114102, filed on Nov. 3, 2011, the entirety of which is incorporated by reference herein.

BACKGROUND

1. Field

Display substrates and methods of fabricating the same are disclosed.

2. Description of the Related Technology

Display substrates have been widely used in thin and light flat panel display apparatuses, for example, liquid crystal display (LCD) apparatuses or organic electro-luminescence display (OELD) apparatuses.

A plurality of pixels may be disposed on the display substrate in a matrix form, and electric signals may be applied to the pixels to generate images. The display substrate may include signal lines such as gate lines and data lines intersecting each other in a plan view, and the signal lines may be insulated from each other by an insulation layer. The gate lines may be connected to thin film transistors, and the thin film transistors may transmit signals applied to the data lines to the pixels in response to voltages applied to the gate lines to display images.

As described above, the signal lines should be insulated from each other by the insulation layer. However, some contaminants may be introduced into the insulation layer while the display substrate is fabricated. Thus, some of the signal lines may be electrically shorted due to the contaminants.

SUMMARY OF CERTAIN INVENTIVE ASPECTS

Exemplary embodiments are directed to display substrates and method of fabricating the same.

One inventive aspect is a display substrate including a first signal line disposed on a base substrate, the first signal line including a first region and a pair of second regions disposed on opposite sides of the first region and spaced apart from the first region. The substrate also includes a second signal line insulated from the first signal line and disposed to cross the first signal line, the second signal line including a third region and a pair of fourth regions disposed on opposite sides of the third region and spaced apart from the third region. The substrate also includes a first detour signal line insulated from the second signal line and the first region and electrically connected to each of the pair of second regions, and a second detour signal line insulated from the first signal line and the first detour signal line and electrically connected to each of the pair of fourth regions.

Another inventive aspect is a display substrate including a first signal line disposed on a base substrate and a second signal line insulated from the first signal line and disposed to cross the first signal line. The substrate also includes a first insulation layer covering at least the first signal line in an intersection region of the first and second signal lines and exposing first and second segments of the first signal line located on opposite sides of the intersection region. The substrate also includes a first detour signal line disposed on the first insulation layer electrically connecting the first segment of the first signal line to the second segment of the first signal line. The substrate also includes a second insulation layer covering at least the first detour signal line and exposing first and second segments of the second signal line located on opposite sides of the intersection region, and a second detour signal line disposed on the second insulation layer electrically connecting the first segment of the second signal line to the second segment of the second signal line. The first and second signal lines in the intersection region are electrically isolated from the first and second segments of each of the first and second signal lines.

Another inventive aspect is a method of fabricating a display substrate, the method including forming a first signal line on a substrate, forming a second signal line insulated from the first signal line and disposed to cross the first signal line. The method also includes cutting each of the first and second signal lines to isolate portions of the first and second signal lines in an intersection region of the first and second signal lines, forming a first insulation layer to cover at least the first signal line located in the intersection region, the first insulation layer exposing first and second segments of the first signal line located on opposite sides of the isolated portion of the first signal line, the first and second segments of the first signal line being isolated from the isolated portion of the first signal line. The method also includes forming a first detour signal line on the first insulation layer to electrically connect the first segment of the first signal line to the second segment of the first signal line, and forming a second insulation layer to cover at least the first detour signal line, the second insulation layer exposing first and second segments of the second signal line located on opposite sides of the isolated portion of the second signal line, the first and second segments of the second signal line being isolated from the isolated portion of the second signal line. The method also includes forming a second detour signal line on the second insulation layer to electrically connect the first segment of the second signal line to the second segment of the second signal line.

BRIEF DESCRIPTION OF THE DRAWINGS

The above and other features and advantages will become more apparent in view of the attached drawings and accompanying detailed description.

FIG. 4B is a cross sectional view taken along a line II-II' of FIG. 4A.

FIGS. 6B and 6C are cross sectional views taken along lines V-V' and VI-VI' of FIG. 6A, respectively.

FIG. 7B is a cross sectional view taken along a line VII-VII' of FIG. 7A.

FIG. 9B is a cross sectional view taken along a line X-X' of FIG. 9A.

FIG. 9C is a cross sectional view taken along a line XI-XI' of FIG. 9A.

DETAILED DESCRIPTION OF THE EMBODIMENTS

Exemplary embodiments will be described hereinafter in detail with reference to the accompanying drawings.

Figure 1:
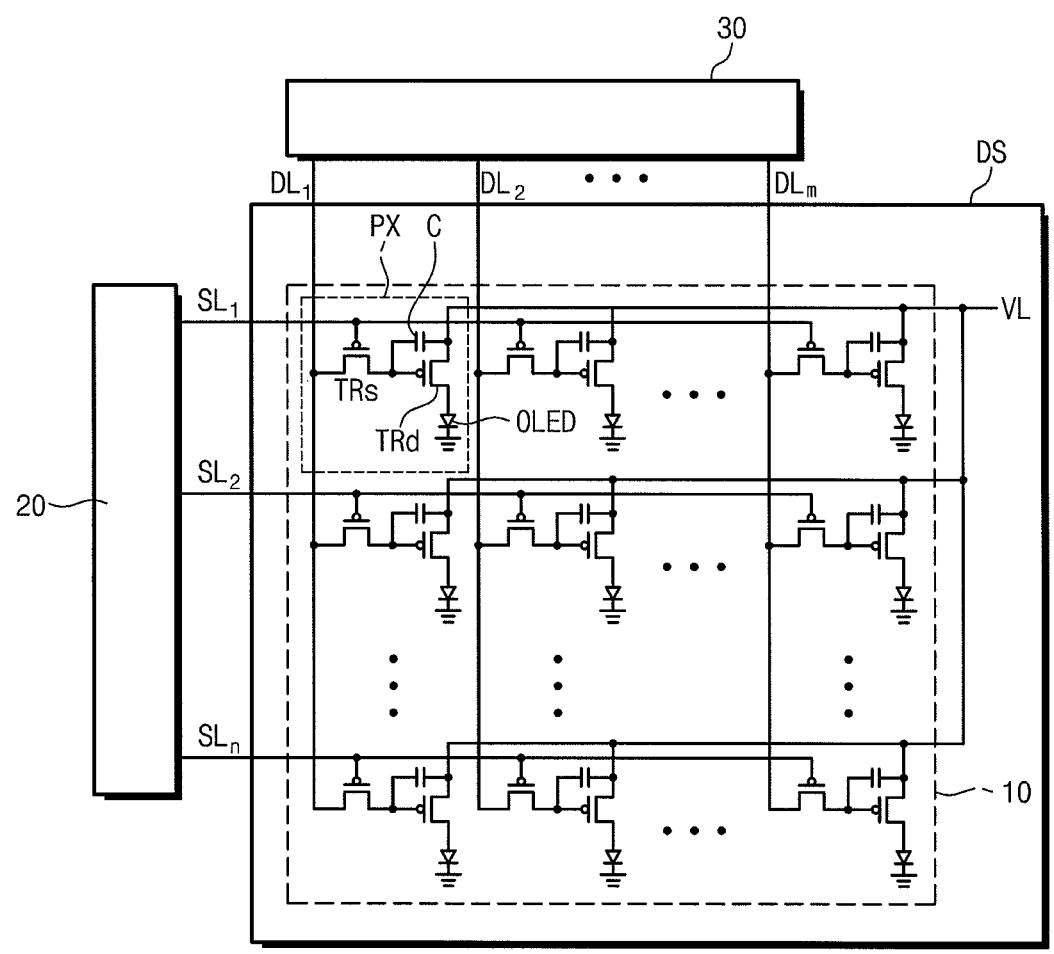
FIG. 1 is an equivalent circuit diagram illustrating a flat display apparatus including a display substrate according to an exemplary embodiment.
Figure 2:
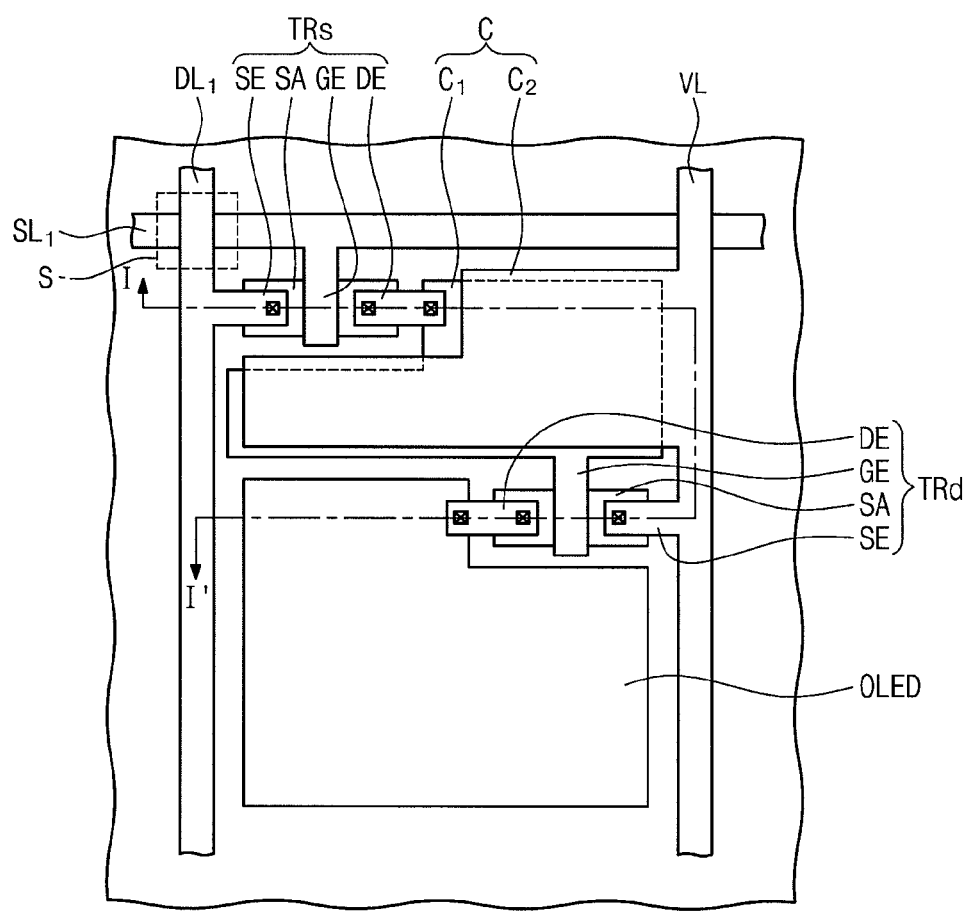
FIG. 2 is a plan view illustrating one of pixels shown in FIG. 1.
Figure 3:
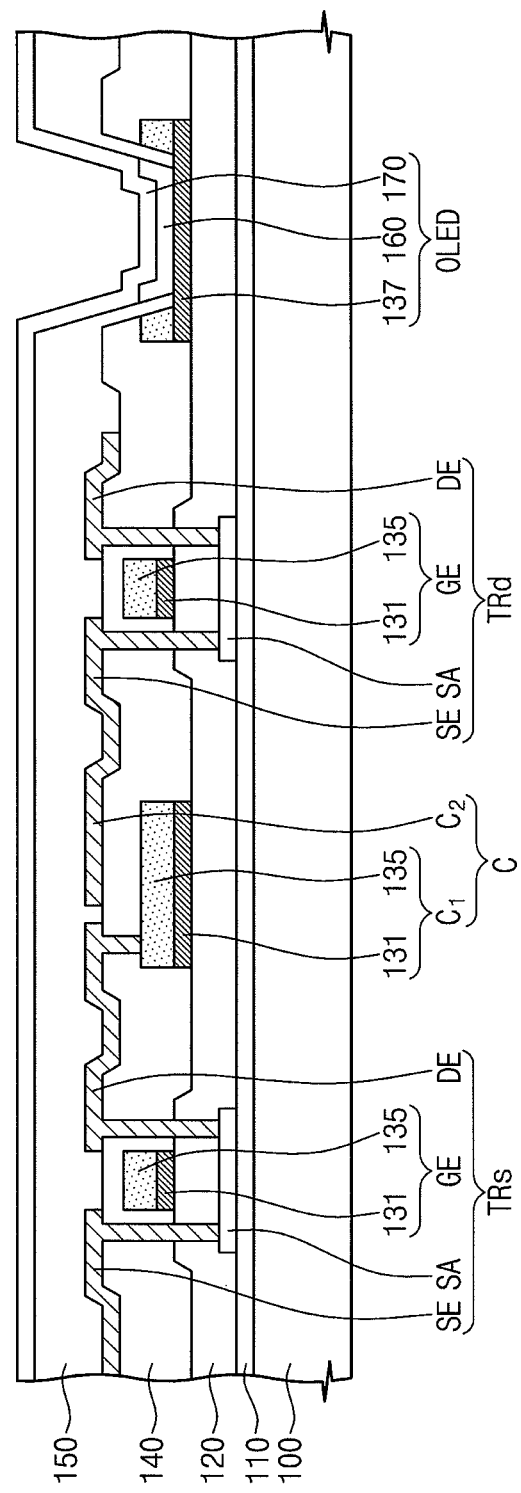
FIG. 3 is a cross sectional view taken along a line I-I' of FIG. 2.

FIG. 1 is a circuit diagram illustrating a flat display apparatus including a display substrate according to an exemplary embodiment, and FIG. 2 is a plan view illustrating one of pixels shown in FIG. 1. FIG. 3 is a cross sectional view taken along a line I-I' of FIG. 2.

Referring to FIGS. 1, 2 and 3, a display substrate DS according to an exemplary embodiment may be applied to a flat panel display apparatus such as a liquid crystal display (LCD) apparatus or an organic electro-luminescence display (OELD) apparatus. The following exemplary embodiments are described in conjunction with an example where the display substrate DS is employed in the organic electro-luminescence display (OELD) apparatus. The OELD apparatus may include the display substrate DS having a display portion 10, a scan driver 20 and a data driver 30.

The scan driver 20 and the data driver 30 may be electrically connected to the display portion 10 through signal lines. The signal lines may include scan lines SL1, SL2 . . . and SLn, data lines DL1, DL2 . . . and DLm, and power supply lines VL. One of the signal lines may intersect another signal line.

More specifically, the scan driver 20 may be electrically connected to the display portion 10 through the scan lines SL1, SL2 . . . and SLn. That is, scan signals generated from the scan driver 20 may be transmitted to the display portion 10 through the scan lines SL1, SL2 . . . and SLn. The scan lines SL1, SL2 . . . and SLn may extend in one direction, for example, in a first direction.

The data driver 30 may be electrically connected to the display portion 10 through the data lines DL1, DL2 . . . and DLm. That is, data signals generated from the data driver 30 may be transmitted to the display portion 10 through the data lines DL1, DL2 . . . and DLm. The data lines DL1, DL2 . . . and DLm may extend in a different direction from the first direction, for example, in a second direction, thereby intersecting the scan lines SL1, SL2 . . . and SLn. That is, the data lines DL1, DL2 . . . and DLm may intersect the scan lines SL1, SL2 . . . and SLn.

The power supply lines VL may supply a power signal to the display portion 10. The power supply lines VL may intersect the scan lines SL1, SL2 . . . and SLn, and the data lines DL1, DL2 . . . and DLm.

The display portion 10 may include a plurality of pixels PX. Each of the pixels PX may be electrically connected to the corresponding one of the data lines DL1, DL2 . . . and DLm, the corresponding one of the scan lines SL1, SL2 . . . and SLn, and the corresponding one of the power supply lines VL. Each of the pixels PX may include a switching thin film transistor TRs, a driver thin film transistor TRd, a capacitor C and an organic light emitting diode (OLED).

The switching thin film transistor TRs may be electrically connected to the corresponding one of the scan lines SL1, SL2 . . . and SLn, and the correspond one of the data lines DL1, DL2 . . . and DLm. Further, the driver thin film transistor TRd may be electrically connected to the corresponding one of the power supply lines VL. Each of the switching thin film transistor TRs and the driver thin film transistor TRd may include a semiconductor active layer SA, a gate electrode GE insulated from the semiconductor active layer SA, and source and drain electrodes SE and DE connected to the semiconductor active layer SA.

The operation of the organic electro-luminescence display (OELD) apparatuses is briefly described. First, the first scan line SL1 may be selected. That is, a first scan signal from the scan driver 20 and all the data signals from the data driver 30 may be applied to the switching thin film transistors TRs arrayed in a first row through the first scan line SL1 and all the data lines DL1, DL2 . . . and DLm, respectively. If the first scan signal has a logically high level turning on the switching thin film transistors TRs, the switching thin film transistors TRs may transmit the data signals to the gate electrodes GE of the driver thin film transistors TRd arrayed in the first row. In this case, the driver thin film transistors TRd may generate and output driving currents that correspond to the data signals, and the driving currents may flow through the organic light emitting diodes (OLEDs) of the pixels arrayed in the first row. Thus, the organic light emitting diodes (OLEDs) may generate lights having their own colors that correspond to the driving currents. Subsequently, the second scan line SL2 to the last scan line SLn may be sequentially selected, and the above described operation may be repeatedly performed whenever each of the scan lines is selected. Accordingly, an image may be provided.

In each of the pixels PX, the gate electrode GE and the drain electrode DE of the driver thin film transistor TRd may be connected to one terminal and the other terminal of the capacitor C, respectively. The capacitor C may hold the data signal for a predetermined period. Thus, even though the switching thin film transistor TRs is turned off, the data signal may be continuously and stably applied to the gate electrode GE of the driver thin film transistor TRd for the predetermined period.

Although not shown in the drawings, the organic electro-luminescence display (OELD) apparatuses may further include additional thin film transistors and additional capacitors to compensate a threshold voltage of the driver thin film transistors TRd.

The display substrate DS is described in more detail with reference to FIG. 3. Referring to FIG. 3, each of the pixels PX of the display substrate DS may be electrically connected to the corresponding one of the data lines DL1, DL2 . . . and DLm, the corresponding one of the scan lines SL1, SL2 . . . and SLn, and the corresponding one of the power supply lines VL. Further, the pixel PX may include the switching thin film transistor TRs, the driver thin film transistor TRd, the capacitor C electrically connected to the switching thin film transistor TRs and the driver thin film transistor TRd, and the organic light emitting device.

The switching thin film transistor TRs may be connected to the corresponding one of the scan lines SL1, SL2 . . . and SLn, and the correspond one of the data lines DL1, DL2 . . . and DLm. Each of the switching thin film transistor TRs and the driver thin film transistor TRd may include the semiconductor active layer SA, the gate electrode GE insulated from the semiconductor active layer SA, and the source and drain electrodes SE and DE connected to the semiconductor active layer SA. More specifically, the semiconductor active layers SA, the gate electrodes GE, and the source and drain electrodes SE and DE constituting the switching thin film transistor TRs and the driver thin film transistor TRd may be disposed on a base substrate 100 that is formed of a transparent glass material or a transparent plastic material.

The semiconductor active layer SA may be a polysilicon material. The semiconductor active layer SA may include source and drain regions doped with impurities, and a channel region between the source and drain regions. The source region and the drain region may be connected to the source electrode SE and the drain electrode DE, respectively.

A buffer layer 110 may be disposed between the base substrate 100 and the semiconductor active layer SA. The buffer layer 110 may be formed of at least one of a silicon oxide layer and a silicon nitride layer. Thus, the buffer layer 110 may have a single-layered structure or a multi-layered structure. The buffer layer 110 may prevent impurities in the base substrate 100 from being diffused into the switching thin film transistor TRs, the driver thin film transistor TRd and the organic light emitting device OLED. Further, the buffer layer 110 may prevent external moisture and oxygen from being diffused into the switching thin film transistor TRs, the driver thin film transistor TRd and the organic light emitting device OLED. Moreover, the buffer layer 110 may provide a planarized surface on the base substrate 100.

A gate insulation layer 120 may be disposed on the semiconductor active layers SA and the buffer layer 110 opposite to the base substrate 100. The gate insulation layer 120 may cover the semiconductor active layers SA to insulate the gate electrodes GE from the semiconductor active layers SA. The gate insulation layer 120 may include a silicon oxide layer and/or a silicon nitride layer.

The scan line SL1 may be disposed on the gate insulation layer 120 to extend in one direction. A portion of the scan line SL1 may extend into the pixel PX to act as the gate electrode GE overlapping with the channel region of the semiconductor active layer SA that constitutes the switching thin film transistor TRs. The scan line SL1 and the gate electrode GE may include a first conductive layer 131 and a second conductive layer 135 stacked on the first conductive layer 131. The first conductive layer 131 may include a transparent conductive oxide material. For example, the first conductive layer 131 may include any one of indium tin oxide (ITO), indium zinc oxide (IZO), aluminum zinc oxide (AZO), gallium doped zinc oxide (GZO), zinc tin oxide (ZTO), gallium tin oxide (GTO) and fluorine doped tin oxide (FTO). The second conductive layer 135 may include at least one of molybdenum (Mo), molybdenum tungsten (MoW), chrome (Cr), aluminum (Al), aluminum neodymium (AlNd) and aluminum alloy.

An interlayer insulation layer 140 may be disposed on the gate insulation 120 and the gate electrodes GE. The gate insulation 120 may include a silicon oxide layer and/or a silicon nitride layer. The interlayer insulation layer 140 may include contact holes that expose the source regions and the drain regions of the semiconductor active layers SA.

The data line DL1 and the power supply line VL intersecting the scan line SL1, the source electrodes SE, and the drain electrodes DE may be disposed on the interlayer insulation layer 140 opposite to the gate insulation layer 120. Thus, the interlayer insulation layer 140 may insulate the scan line SL1 from the data line DL1, the power supply line VL, the source electrodes SE and the drain electrodes DE. The source electrodes SE and the drain electrodes DE may be connected to the source regions and the drain regions through the contact holes, respectively. Each of the source electrodes SE and the drain electrodes DE may include conductive metal and/or conductive polymer.

The capacitor C may include a first capacitor electrode C1 and a second capacitor electrode C2. The first capacitor electrode C1 may be composed of the same material as the scan lines SL1, SL2 . . . and SLn and the gate electrodes GE. Further, the first capacitor electrode C1 may be disposed at the same level as the scan lines SL1, SL2 . . . and SLn and the gate electrodes GE. That is, the first capacitor electrode C1 may be disposed between the gate insulation layer 120 and the interlayer insulation layer 140, and the first capacitor electrode C1 may have a double-layered structure including the first conductive layer 131 and the second conductive layer 135. Alternatively, the first capacitor electrode C1 may be composed of only one of the first conductive layer 131 and the second conductive layer 135.

The second capacitor electrode C2 may be composed of the same material as the data lines DL1, DL2 . . . and DLm, the source electrodes SE and the drain electrode DE. Further, the second capacitor electrode C2 may be disposed at the same level as the data lines DL1, DL2 . . . and DLm, the source electrodes SE and the drain electrodes DE. That is, the second capacitor electrode C2 may be disposed on the interlayer insulation layer 140 opposite to the gate insulation layer 120.

The organic light emitting device OLED may include a first electrode 137 connected to the drain electrode DE of the driver thin film transistor TRd, an organic material layer 160 disposed on the first electrode 137, and a second electrode 170 disposed on the organic material layer 160 opposite to the first electrode 137. One of the first electrode 137 and the second electrode 170 may be an anode and the other may be a cathode. The present embodiment is described in conjunction with an example that the first and second electrodes 137 and 170 are an anode and a cathode, respectively. The first electrode 137 may be composed of the same material as the first conductive layer 131 of the gate electrodes GE and may be disposed at the same level as the first conductive layer 131. That is, the first electrode 137 may be disposed on the gate insulation layer 120 opposite to the base substrate 100. A portion of the first electrode 137 may be exposed by an opening penetrating a protection layer 150 that covers the switching thin film transistor TRs and the driver thin film transistor TRd.

The organic material, layer 160 may be disposed on the exposed first electrode 137. The organic material layer 160 may include at least an emission layer (EML) and may have a multi-layered film structure. For example, the organic material layer 160 may include a hole injection layer (HIL), a hole transport layer (HTL), the emission layer (EML), a hole blocking layer (HBL), an electron transport layer (ETL) and an electron injection layer (EIL). The hole injection layer (HIL) may inject holes into the emission layer (EML), and the hole transport layer (HTL) may have an excellent hole transportability and may suppress migration of electrons not combined with holes in the emission layer (EML) to increase the possibility of recombination of the electrons and the holes. The emission layer (EML) may generate lights when the injected holes and electrons are recombined with each other, the hole blocking layer (HBL) may suppress migration of holes not combined with electrons in the emission layer (EML). The electron transport layer (ETL) may transport electrons into the emission layer (EML), and the electron injection layer (EIL) may inject electrons into the emission layer (EML).

The second electrode 170 may reflect light and may include a material having a lower work function than the first electrode 137. For example, the second electrode 170 may include at least one of molybdenum (Mo), molybdenum tungsten (MoW), chrome (Cr), aluminum (Al), aluminum neodymium (AlNd) and aluminum alloy.

Figure 4A:
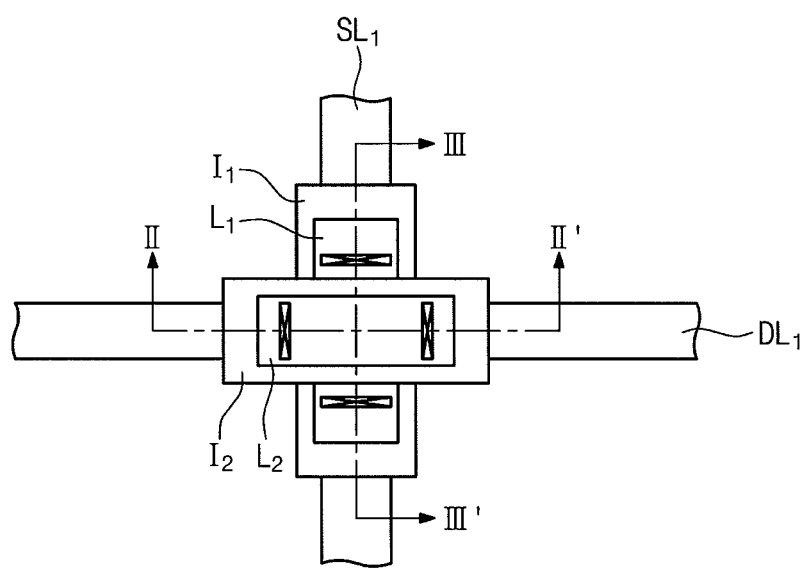
FIG. 4A is an enlarged view illustrating a portion 'S' of FIG. 2.
Figure 4C:
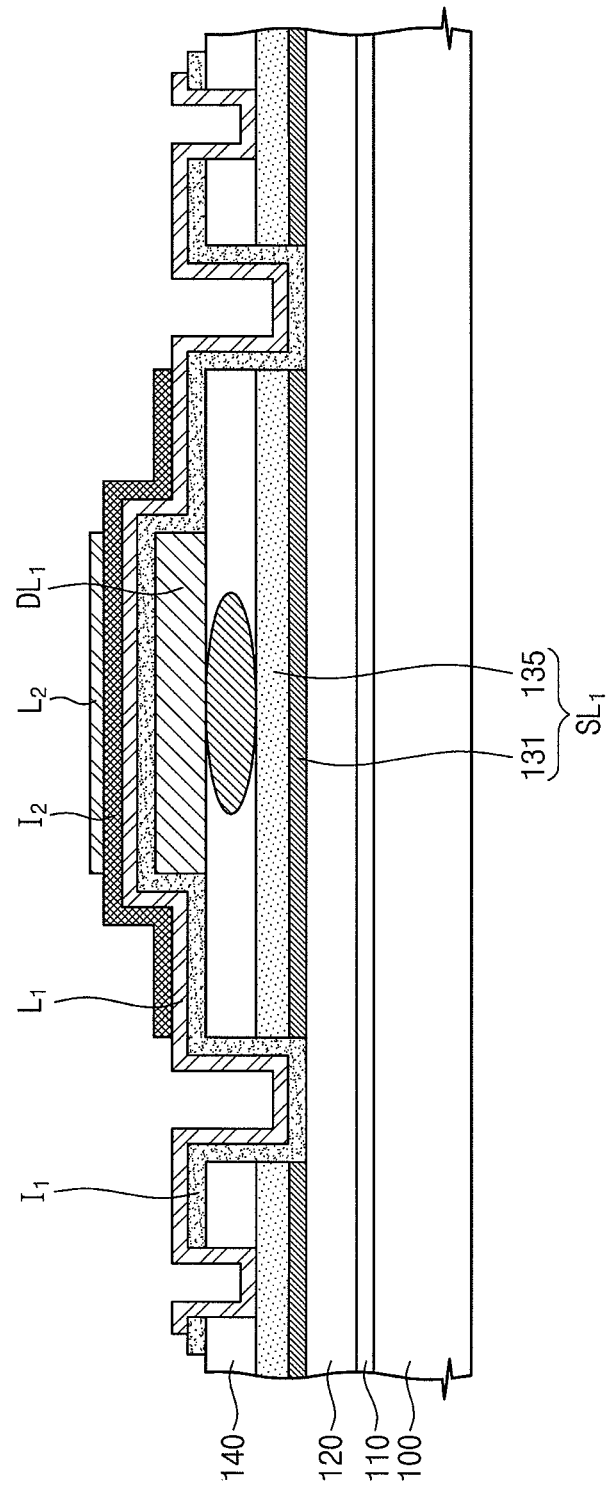
FIG. 4C is a cross sectional view taken along a line III-III' of FIG. 4A.

FIG. 4A is an enlarged view illustrating a portion 'S' of FIG. 2. FIG. 4B is a cross sectional view taken along a line II-II' of FIG. 4A, and FIG. 4C is a cross sectional view taken along a line III-III' of FIG. 4A. Referring to FIGS. 4A, 4B and 4C, a plurality of signal lines may be disposed on the base substrate 100.

More specifically, a first signal line, for example, the scan line SL1 may be disposed on the base substrate 100 to extend in one direction. Further, a second signal line, for example, the data line DL1 may be disposed to cross the scan line SL1 and may be insulated from the scan line SL1. The scan line SL1 and the data line DL1 may be insulated from each other by the interlayer insulation layer 140.

A contaminant may be introduced into the interlayer insulation layer 140 during formation of the interlayer insulation layer 140. In the event that the contaminant is formed at a cross point (e.g., an intersection region) of the scan line SL1 and the data line DL1, the scan line SL1 and the data line DL1 may be electrically connected to each other by the contaminant. That is, the contaminant may cause an electrical short fail between the scan line SL1 and the data line DL1.

To repair the electrical short fail, the scan line SL1 may be separated into an isolated region, having the contaminant connected thereto, in the intersection region and connection regions on both sides of the isolated region. Similarly, the data line DL1 may be separated into an isolated region, having the contaminant connected thereto, in the intersection region and connection regions on both sides of the isolated region. That is, the scan line SL1 corresponding to the first signal line may be divided into a first region disposed in the intersection region and second regions disposed on both sides of the first region, and the data line SL1 corresponding to the second signal line may also be divided into a third region disposed in the intersection region and fourth regions disposed on both sides of the third region. Thus, the first region may overlap with the third region, where the first and third regions are electrically connected by the contaminant.

A first insulation layer I1 may be disposed on the second signal line for example, the data line DL1. The first insulation layer I1 may be disposed to cover at least the isolation regions, for example, the first and third regions. The first insulation layer I1 may expose portions of the second regions of the first signal line (e.g., the scan line SL1).

A first detour signal line L1 may be disposed on the first insulation layer I1 and may electrically connect the second regions of the scan line SL1 to each other. Thus, even though the first and third regions in the intersection region are electrically connected by the contaminant, the second regions of the scan line SL1 may be electrically connected to each other and may be isolated from the first region, the contaminant, and data line DL1.

A second insulation layer I2 may be disposed on the first detour signal line L1 at least in the intersection region. That is, the second insulation layer I2 may be disposed to cover at least the first and third regions. The second insulation layer I2 may expose portions of the fourth regions of the second signal line (e.g., the data line DL1).

A second detour signal line L2 may be disposed on the second insulation layer I2 and may electrically connect the fourth regions of the data line DL1 to each other. Thus, even though the first and third regions in the intersection region are electrically connected by the contaminant, the fourth regions of the data line DL1 may be electrically connected to each other and may be isolated from the third region, the contaminant, and scan line SL1.

The present embodiment is described in conjunction with an example that the first and second signal lines are the scan line SL1 and the data line DL1, respectively. However, the inventive concept is not limited to the above example. For example, the first and second signal lines may correspond to the scan line SL1 and the power supply line VL, respectively.

A method of fabricating a display substrate according to an exemplary embodiment will be described hereinafter with reference to FIGS. 4A to 4C, FIGS. 5A and 5B, FIGS. 6A to 6C, and FIGS. 7A and 7B. In the drawings of FIGS. 4A to 4C, FIGS. 5A and 5B, FIGS. 6A to 6C, and FIGS. 7A and 7B, the same reference designators as used in the drawings of FIGS. 1 to 3 generally denote the same elements as illustrated in FIGS. 1 to 3. Thus, for the purpose of simplification in explanation, detailed descriptions to the same elements as illustrated in FIGS. 1 to 3 may be omitted.

Figure 5A:
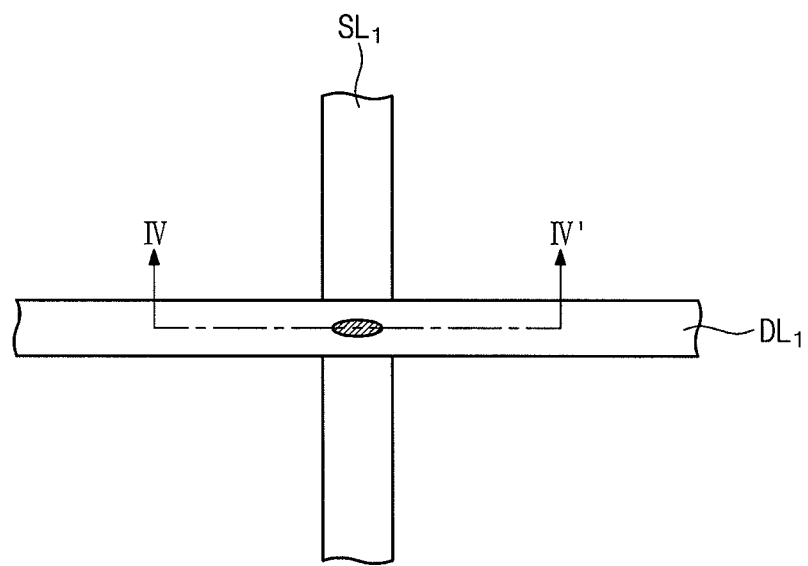
FIGS. 5A, 6A and 7A are partial plan views illustrating a method of fabricating a display substrate according to an exemplary embodiment.
Figure 5B:
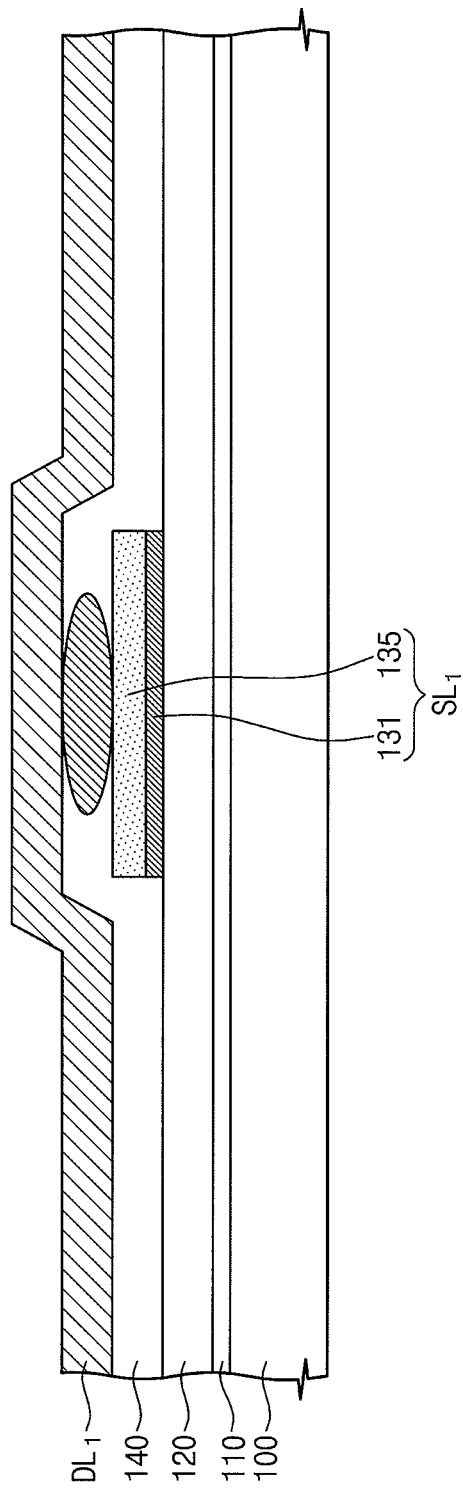
FIG. 5B is a cross sectional view taken along a line IV-IV' of FIG. 5A.
Figure 6A:
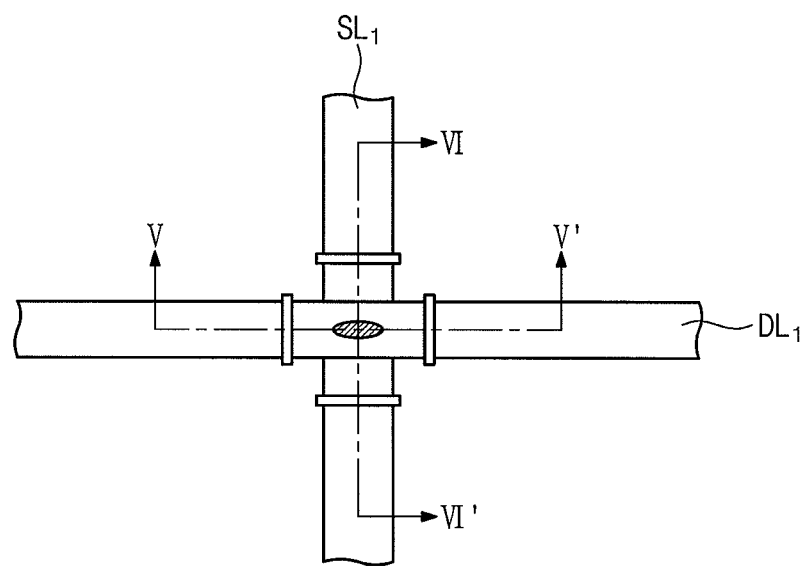
Figure 6B:
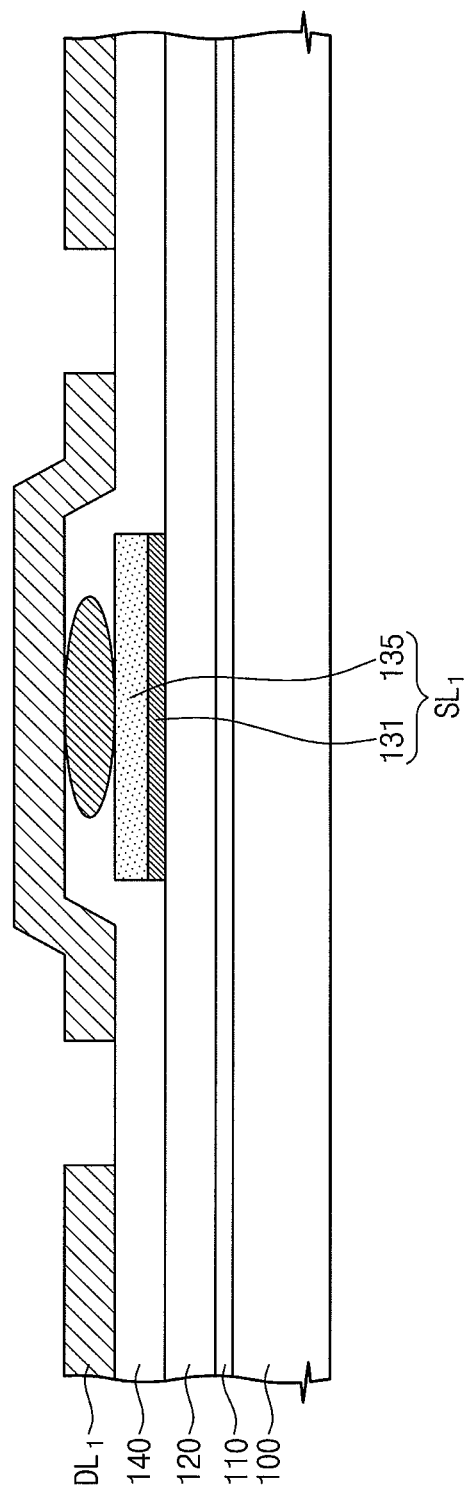
Figure 7A:
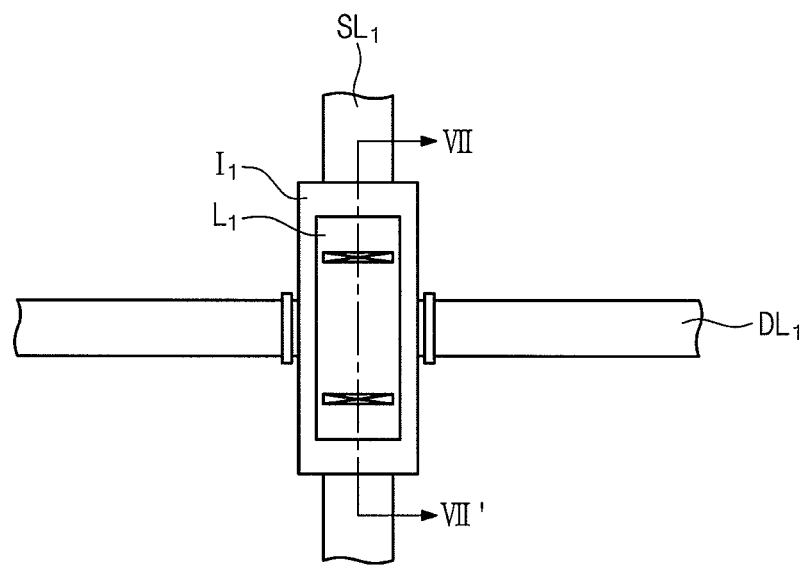

FIGS. 5A, 6A and 7A are partial plan views illustrating a method of fabricating a display substrate according to an exemplary embodiment, and FIG. 5B is a cross sectional view taken along a line IV-IV' of FIG. 5A. FIGS. 6B and 6C are cross sectional views taken along lines V-V' and VI-VI' of FIG. 6A, respectively. FIG. 7B is a cross sectional view taken along a line VII-VII' of FIG. 7A.

Referring to FIGS. 5A and 5B, signal lines and pixels PX may be formed on a base substrate 100. The signal lines may be formed to include scan lines SL1, SL2, and SLn, data lines DL1, DL2, . . . and DLm, and power supply lines VL which are illustrated in FIGS. 1 to 3. The pixels PX may be formed to include switching thin film transistors TRs, driver thin film transistors TRd, capacitors C and organic light emitting devices OLED which are illustrated in FIGS. 1 to 3.

The scan lines SL1, SL2, . . . and SLn may be formed at the same level as gate electrodes GE of the switching thin film transistors TRs and the driver thin film transistors TRd. The data lines DL1, DL2, . . . and DLm and the power supply lines VL may be formed at the same level as source and drain electrodes SE and DE of the switching thin film transistors TRs and the driver thin film transistors TRd.

An interlayer insulation layer 140 may be formed between the scan lines SL1, SL2, . . . and SLn and the data lines DL1, DL2, . . . and DLm and between the scan lines SL1, SL2, . . . and SLn and the power supply lines VL.

While the interlayer insulation layer 140 is formed, contaminant may be introduced into the interlayer insulation layer 140. The contaminant may cause an electrical short fail between the scan lines SL1, SL2, . . . and SLn and the data lines DL1, DL2, . . . and DLm at intersection regions of the scan lines SL1, SL2, . . . and SLn and the data lines DL1, DL2, . . . and DLm and/or at intersection regions of the scan lines SL1, SL2, . . . and SLn and the power supply lines VL. In the event that the electrical short fail occurs, normal signals may not be applied to the pixels PX connected to the signal lines. Thus, some pixels PX may malfunction. Hereinafter, the present embodiment will be described in conjunction with an example that the electrical short fail occurs at the intersection regions of the scan lines SL1, SL2, . . . and SLn and the data lines DL1, DL2, . . . and DLm.

Referring to FIGS. 6A, 6B and 6C, in the event that the electrical short fail occurs at the intersection region of the scan line SL1 and the data line DL1, two portions of the scan line SL1 and two portions of the data line DL1 may be cut using a laser to isolate a portion of the scan line SL1 and a portion of the data line DL1, which are located in the intersection region. Two segments of the scan line SL1 remaining at both sides of the isolated scan line SL1 may correspond to connection regions of the scan line SL1, and two segments of the data line DL1 remaining at both sides of the isolated data line DL1 may correspond to connection regions of the data line DL1.

Referring to FIGS. 7A and 7B, after some portions of the scan line SL1 and the data line DL1 are cut using the laser, a first insulation layer I1 may be formed to cover the isolated scan line SL1 and the isolated data line DL1 in the intersection region. After formation of the first insulation layer I1, the first insulation layer I1 may be patterned to form first contact holes exposing portions of the connection regions of the scan line SL1. Subsequently, a conductive layer may be formed on the first insulation layer I1, and the conductive layer may be patterned to form a first detour signal line L1 that electrically connects the connection regions of the scan line SL1 to each other through the first contact holes.

After formation of the first detour signal line L1, a second insulation layer I2 may be formed on the substrate including the first detour signal line L1, as illustrated in FIGS. 4A, 4B and 4C. The second insulation layer I2 may be formed to cover at least the first detour signal line L1. After formation of the second insulation layer I2, the second insulation layer I2 may be patterned to form second contact holes exposing portions of the connection regions of the data line DL1. Subsequently, a conductive layer may be formed on the second insulation layer I2, and the conductive layer may be patterned to form a second detour signal line L2 that electrically connects the connection regions of the data line DL1 to each other through the second contact holes.

As described above, in the event that the electrical short fail occurs at the intersection region of the signal lines, the signal lines may be cut using a laser to electrically isolate portions of the signal lines in the intersection region. Further, the first and second detour signal lines may be formed to electrically connect the connection regions remaining at both sides of the isolated regions of the signal lines. As such, the electrical short fail between two signal lines intersecting each other is repaired.

Now, another exemplary embodiment will be described with reference to FIGS. 8A to 8C and FIGS. 9A to 9C. In the drawings of FIGS. 8A to 8C and FIGS. 9A to 9C, the same reference designators as used in FIGS. 1 to 7 generally denote the same elements as illustrated in FIGS. 1 to 7. Thus, detailed descriptions to the same elements as illustrated in FIGS. 1 to 7 may be omitted. Further, to avoid duplicate explanations, differences between the present embodiment and the previous embodiment will be mainly described in detail hereinafter.

Figure 8A:
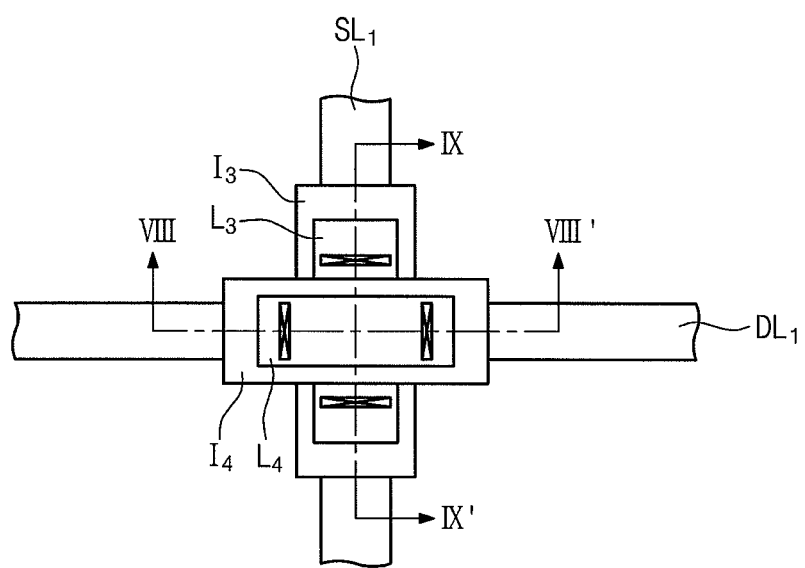
FIG. 8A is a partial plan view illustrating a display substrate according to another exemplary embodiment.
Figure 8B:
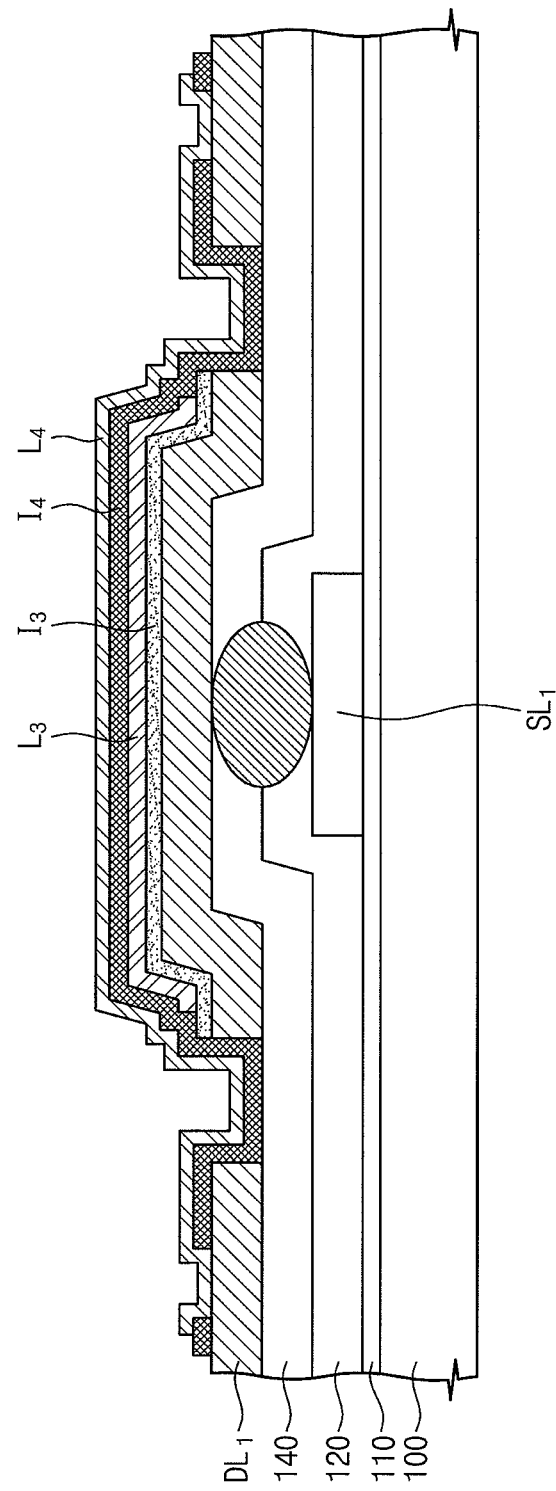
FIG. 8B is a cross sectional view taken along a line VIII-VIII' of FIG. 8A.

FIG. 8A is a partial plan view illustrating a display substrate according to another exemplary embodiment. FIG. 8B is a cross sectional view taken along a line VIII-VIII' of FIG. 8A, and FIG. 8C is a cross sectional view taken along a line IX-IX' of FIG. 8A.

Figure 8C:
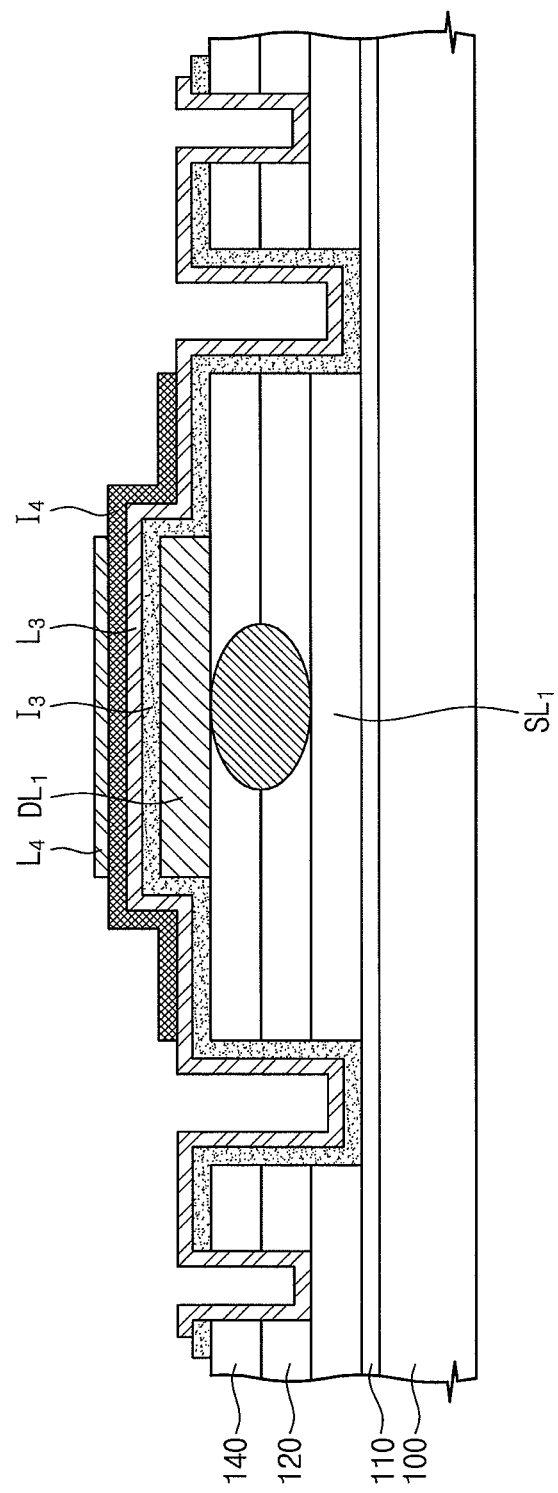
FIG. 8C is a cross sectional view taken along a line IX-IX' of FIG. 8A.

Referring to FIGS. 8A, 8B and 8C, signal lines and pixels PX may be formed on a base substrate 100. The signal lines may be formed to include scan lines SL1, SL2, . . . and SLn, data lines DL1, DL2, . . . and DLm, and power supply lines VL which are illustrated in FIGS. 1 to 3. The pixels PX may be formed to include switching thin film transistors TRs, driver thin film transistors TRd, capacitors C and organic light emitting devices OLED which are illustrated in FIGS. 1 to 3.

The scan line SL1 and the data line DL1 may be disposed to cross each other and may be insulated from each other. The scan line SL1 may be disposed at the same level as semiconductor active layers SA of the switching thin film transistors TRs and the driver thin film transistors TRd. Further, the data line DL1 and the power supply lines VL may be disposed at the same level as source and drain electrodes SE and DE of the switching thin film transistors TRs and the driver thin film transistors TRd. The scan line SL1 and the data line DL1 may be insulated from each other by a gate insulation layer 120 and an interlayer insulation layer 140.

An electrical short fail between the scan line SL1 and the data line DL1 may occur at an intersection region of the scan line SL1 and the data line DL1.

To repair the electrical short fail, the scan line SL1 may be separated into an isolated region in the intersection region and connection regions at both sides of the isolated region. Similarly, the data line DL1 may be separated into an isolated region in the intersection region and connection regions at both sides of the isolated region.

The connection regions of the scan line SL1 may be electrically connected to each other by a third detour signal line L3 insulated from the data line DL1. The third detour signal line L3 may be insulated from the data line DL1 by a third insulation layer I3.

Moreover, the connection regions of the data line DL1 may be electrically connected to each other by a fourth detour signal line L4 insulated from the third detour signal line L3. The fourth detour signal line L4 may be insulated from the third detour signal line L3 by a fourth insulation layer I4.

Figure 9A:
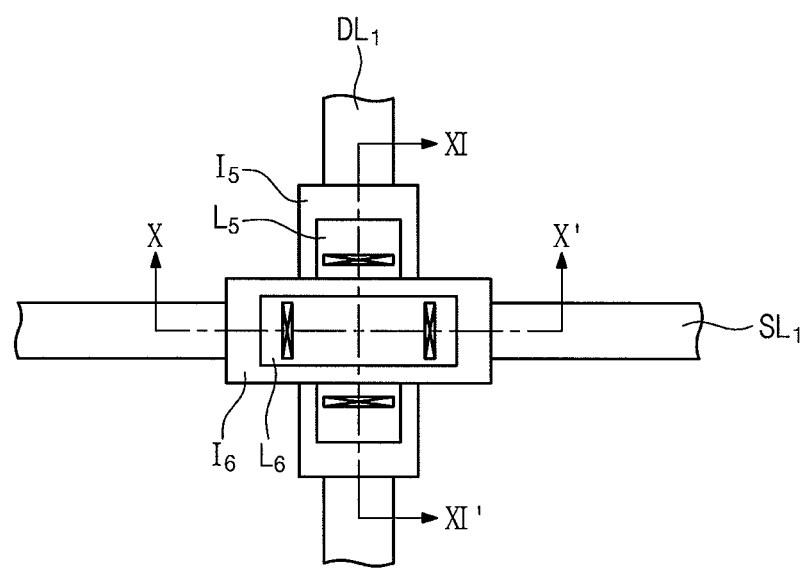
FIG. 9A is a partial plan view illustrating a display substrate according to yet another exemplary embodiment.

FIG. 9A is a partial plan view illustrating a display substrate according to yet another exemplary embodiment. FIG. 9B is a cross sectional view taken along a line X-X' of FIG. 9A, and FIG. 9C is a cross sectional view taken along a line XI-XI' of FIG. 9A.

Referring to FIGS. 9A, 9B and 9C, signal lines and pixels PX may be formed on a base substrate 100. The signal lines may be formed to include scan lines SL1, SL2, . . . and SLn, data lines DL1, DL2, . . . and DLm, and power supply lines VL, as illustrated in FIGS. 1 to 3. The pixels PX may be formed to include switching thin film transistors TRs, driver thin film transistors TRd, capacitors C and organic light emitting devices OLED, as illustrated in FIGS. 1 to 3.

The scan line SL1 and the data line DL1 may be disposed to cross each other and may be insulated from each other. The data line DL1 may be disposed at the same level as semiconductor active layers SA of the switching thin film transistors TRs and the driver thin film transistors TRd. Further, the scan line SL1 may be disposed at the same level as gate electrodes GE of the switching thin film transistors TRs and the driver thin film transistors TRd. The scan line SL1 and the data line DL1 may be insulated from each other by a gate insulation layer 120.

An electrical short fail between the scan line SL1 and the data line DL1 may occur at an intersection region of the scan line SL1 and the data line DL1.

To repair the electrical short fail, the scan line SL1 may be separated into an isolated region in the intersection region and connection regions at both sides of the isolated region. Similarly, the data line DL1 may be separated into an isolated region in the intersection region and connection regions at both sides of the isolated region.

The connection regions of the data line DL1 may be electrically connected to each other by a fifth detour signal line L5 insulated from the scan line SL1. The fifth detour signal line L5 may be insulated from the scan line SL1 by a fifth insulation layer I5.

Moreover, the connection regions of the scan line SL1 may be electrically connected to each other by a sixth detour signal line L6 insulated from the fifth detour signal line L5 The sixth detour signal line L6 may be insulated from the fifth detour signal line L5 by a sixth insulation layer I6.

According to the embodiments set forth above, in the event that an electrical short fail occurs at an intersection region of signal lines connected to pixels constituting a display substrate, additional detour signal lines are formed using a laser repair process to solve the electrical short fail. Thus, the additional detour signal lines may prevent the pixels from malfunctioning.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A display substrate comprising:
a first signal line disposed on a base substrate, the first signal line including a first region and a pair of second regions disposed on opposite sides of the first region and spaced apart from the first region;
a second signal line insulated from the first signal line and disposed to cross the first signal line, the second signal line including a third region and a pair of fourth regions disposed on opposite sides of the third region and spaced apart from the third region;
a first detour signal line insulated from the second signal line and the first region by a first insulation layer and electrically connected to each of the pair of second regions; and
a second detour signal line insulated from the first signal line and the first detour signal line by a second insulation layer and electrically connected to each of the pair of fourth regions, wherein the first detour signal line and the second detour signal line overlap on the first and third regions,
wherein the first insulation layer covers at least the first and third regions and exposes a portion of each of the second regions, and
wherein a length of the first insulation layer is longer than the first detour signal line and shorter than the first signal line.

2. The display substrate of claim 1, wherein the first signal line is a data line and the second signal line is a scan line.

3. The display substrate of claim 1, wherein the first signal line is a power supply line and the second signal line is a scan line.

4. The display substrate of claim 1, wherein the second insulation layer covers at least the first and third regions and exposes a portion of each of the fourth regions, and
wherein a length of the second insulation layer is longer than the second detour signal line and shorter than the second signal line.

5. A display substrate comprising:
a first signal line disposed in a first layer and extending in a first direction on a base substrate;
a second signal line insulated from the first signal line and disposed to cross the first signal line in a second layer over the first layer, and extending in a second direction substantially perpendicular to the first direction;
a first insulation layer covering at least the first signal line in an intersection region of the first and second signal lines and exposing first and second segments of the first signal line located on opposite sides of the intersection region;
a first detour signal line disposed in a third layer on the first insulation layer electrically connecting the first segment of the first signal line to the second segment of the first signal line;
a second insulation layer covering at least the first detour signal line and exposing first and second segments of the second signal line located on opposite sides of the intersection region; and
a second detour signal line disposed in a fourth layer on the second insulation layer electrically connecting the first segment of the second signal line to the second segment of the second signal line,
wherein the first and second signal lines in the intersection region are electrically isolated from the first and second segments of each of the first and second signal lines and wherein the first and the second detour signal lines overlap on the intersection region, wherein a length of the first insulation layer is longer than the first detour signal line and shorter than the first signal line in the first direction, and
wherein a length of the second insulation layer is longer than the second detour signal line and shorter than the second signal line in the second direction.

6. The display substrate of claim 5, wherein the first signal line is a data line and the second signal line is a scan line.

7. The display substrate of claim 5, wherein the first signal line is a power supply line and the second signal line is a scan line.

\* \* \* \* \*